United States Patent
Hiatt et al.

(10) Patent No.: US 6,673,649 B1
(45) Date of Patent: Jan. 6, 2004

(54) MICROELECTRONIC DEVICE PACKAGES AND METHODS FOR CONTROLLING THE DISPOSITION OF NON-CONDUCTIVE MATERIALS IN SUCH PACKAGES

(75) Inventors: William Mark Hiatt, Eagle, ID (US); Warren Farnworth, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/190,019

(22) Filed: Jul. 5, 2002

(51) Int. Cl.[7] .............................................. H01L 21/00
(52) U.S. Cl. ........................ 438/105; 438/106; 371/700
(58) Field of Search .......................... 438/106, 105, 438/104, 103, 107, 108, 109, 111, 110; 361/700, 713, 719, 689, 703, 704

(56) References Cited

U.S. PATENT DOCUMENTS

| | | | |
|---|---|---|---|
| 5,126,829 A | * | 6/1992 | Daikoku et al. ............. 257/713 |
| 5,249,100 A | * | 9/1993 | Satoh et al. ................. 361/689 |
| 5,251,100 A | * | 10/1993 | Fujita et al. ................. 361/719 |
| 5,515,912 A | * | 5/1996 | Daikoku et al. ............ 165/80.4 |
| 5,586,004 A | * | 12/1996 | Green et al. ................. 361/699 |
| 5,677,566 A | | 10/1997 | King et al. |
| 5,774,334 A | * | 6/1998 | Kawamura et al. ......... 361/699 |
| 5,866,953 A | | 2/1999 | Akram et al. |
| 5,891,753 A | | 4/1999 | Akram |
| 5,898,224 A | | 4/1999 | Akram |
| 5,920,768 A | | 7/1999 | Shintai |
| 5,933,713 A | | 8/1999 | Farnworth |
| 5,989,941 A | | 11/1999 | Wensel |
| 6,037,658 A | * | 3/2000 | Brodsky et al. ............. 257/707 |
| 6,046,496 A | | 4/2000 | Corisis et al. |
| 6,048,744 A | | 4/2000 | Corisis et al. |
| 6,048,755 A | | 4/2000 | Jiang et al. |
| 6,049,125 A | | 4/2000 | Brooks et al. |
| 6,072,233 A | | 6/2000 | Corisis et al. |
| 6,075,288 A | | 6/2000 | Akram |
| 6,081,429 A | | 6/2000 | Barrett |
| 6,097,087 A | | 8/2000 | Farnworth et al. |
| 6,107,122 A | | 8/2000 | Wood et al. |
| 6,118,179 A | | 9/2000 | Farnworth et al. |
| 6,122,171 A | | 9/2000 | Akram et al. |
| 6,148,509 A | | 11/2000 | Schoenfeld et al. |
| 6,153,924 A | | 11/2000 | Kinsman |
| 6,159,764 A | | 12/2000 | Kinsman et al. |
| 6,163,956 A | | 12/2000 | Corisis |
| 6,180,504 B1 | | 1/2001 | Farnworth et al. |
| 6,180,527 B1 | | 1/2001 | Farnworth et al. |
| 6,208,519 B1 | | 3/2001 | Jiang et al. |
| 6,215,175 B1 | | 4/2001 | Kinsman |
| 6,252,772 B1 | | 6/2001 | Allen |
| 6,303,981 B1 | | 10/2001 | Moden |
| 6,310,288 B1 | | 10/2001 | Moden |
| 6,310,390 B1 | | 10/2001 | Moden |
| 6,314,639 B1 | | 11/2001 | Corisis |
| 6,326,242 B1 | | 12/2001 | Brooks et al. |
| 6,326,687 B1 | | 12/2001 | Corisis |
| 6,329,222 B1 | | 12/2001 | Corisis et al. |
| 6,337,513 B1 | * | 1/2002 | Clevenger et al. .......... 257/706 |
| 6,344,976 B1 | | 2/2002 | Schoenfeld et al. |
| 6,351,384 B1 | * | 2/2002 | Daikoku et al. ............. 361/704 |
| 6,459,581 B1 | * | 10/2002 | Newton et al. ............. 361/700 |

FOREIGN PATENT DOCUMENTS

| | | | | |
|---|---|---|---|---|
| JP | 08335774 A | * | 12/1996 | ............ H05K/3/34 |
| WO | WO 99/21226 A1 | | 4/1999 | |

\* cited by examiner

*Primary Examiner*—Carl Whitehead, Jr.
*Assistant Examiner*—Laura Schillinger
(74) *Attorney, Agent, or Firm*—Perkins Coie LLP

(57) ABSTRACT

A microelectronic package and method for forming such a package. In one embodiment, the package can include a microelectronic substrate having first connection sites, and a support member having second connection sites and third connection sites, with the third connection sites accessible for electrical coupling to other electrical structures. A plurality of electrically conductive couplers are connected between the first connection sites and the second connection sites, with neighboring conductive couplers being spaced apart to define at least one flow channel. The at least one flow channel is in fluid communication with a region external to the microelectronic substrate. The generally non-conductive material can be spaced apart from the support member to allow the microelectronic substrate to be separated from the support member.

22 Claims, 4 Drawing Sheets

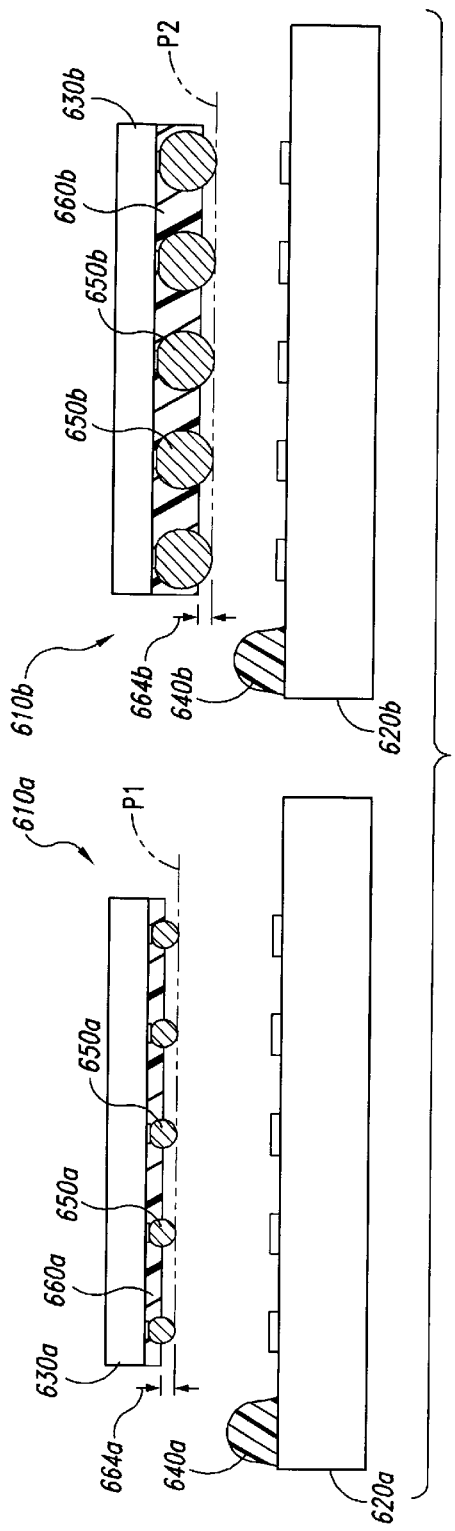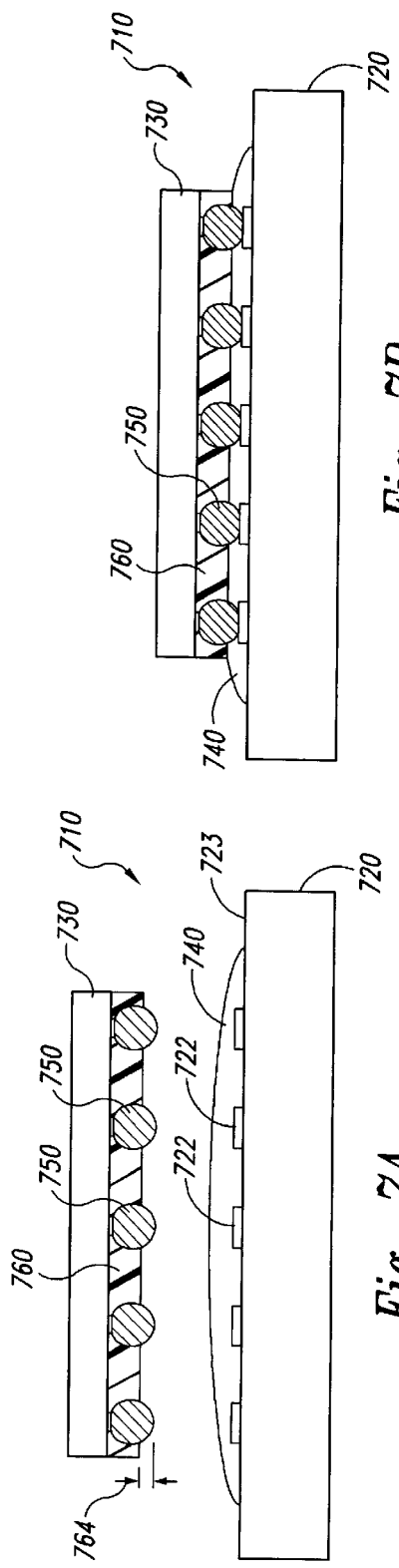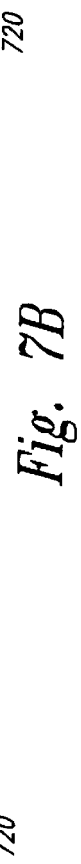
Fig. 6
Fig. 7A
Fig. 7B

MICROELECTRONIC DEVICE PACKAGES AND METHODS FOR CONTROLLING THE DISPOSITION OF NON-CONDUCTIVE MATERIALS IN SUCH PACKAGES

TECHNICAL FIELD

The present invention is directed generally toward microelectronic device packages and methods for controlling the disposition and/or extent of non-conductive materials in such packages.

BACKGROUND

Existing microelectronic device packages typically include a microelectronic substrate or die attached to a support member, such as a printed circuit board. Bond pads or other terminals on the die are electrically connected to corresponding terminals on the support member, for example, with solder balls. The connection between the die and the support member can be encapsulated, for example, with a protective underfill material, to form a device package. The package can then be electrically connected to other microelectronic devices or circuits, for example, in a consumer or industrial electronic product such as a computer.

In one existing arrangement shown in FIG. 1, a package 10 can include a support member 20 that carries a microelectronic die 30. Solder balls 50 provide an electrical connection between upwardly facing bond pads of the support member 20 and downwardly facing bond pads of the die 30. Accordingly, a gap (partially filled by the solder balls) is initially formed between the support member 20 and the die 30.

In one existing process, an underfill material 40 is initially disposed adjacent to two of the outer edges of the die 30. The underfill material 40 flows into the gap between the die 30 and the support member 20 to provide a protective encapsulant around the solder balls 50. The underfill material 40 can flow both directly into the gap (as indicated by arrows A) and around the outer edges of the die 30 (as indicated by arrows B).

One characteristic the process described above with reference to FIG. 1 is that in some cases, the underfill material 40 can flow more quickly around the die 30 (arrows B) than directly into the gap beneath the die 30 (arrows A). Accordingly, the underfill material 40 can trap air or other gases in the gap. A drawback with this arrangement is that the gases within the gap may expand when the temperature of the package 1.0 is elevated, causing the electrical connections provided by the solder balls 50 between the die 30 and the support member 20 to fail.

One existing approach for addressing the foregoing drawback is to control the viscosity of the underfill material 40 so that it preferentially wicks more quickly through the gap than around the periphery of the die 30. For example, the viscosity can be controlled by controlling the temperature at which the underfill process is conducted, or the concentration of particulates in the underfill material 40. Alternatively, the surface characteristics of the die 30 and/or the support member 20 can be selected to produce a faster underfill flow rate through the gap than around the periphery of the die 30. Although the foregoing methods can produce satisfactory results, it may in some cases be difficult and/or expensive to accurately control the aforementioned variables. Furthermore, the underfill material 40 typically provides a permanent bond between the die 30 and the support member 20, making it difficult if not impossible to replace a defective die 30 without destroying the entire package 10.

SUMMARY

The present invention is directed toward microelectronic packages and methods for forming such packages. A method in accordance with one aspect of the invention includes positioning a microelectronic substrate proximate to a support member, with the microelectronic substrate having a first surface, a second surface facing opposite from the first surface, and a plurality of first connection sites at least proximate to the first surface. The support member can have a plurality of second and third connection sites. The method can further include connecting the microelectronic substrate to the support member by attaching a plurality of electrically conductive couplers between the plurality of first connection sites and the second connection sites, with neighboring conducted couplers being spaced apart to define at least one fluid flow channel, and with the support member and the microelectronic substrate forming a package. The package can then be provided for electrical coupling to other electrical structures via the third connection sites, with the at least one fluid flow channel accessible to a region external to the package.

In another aspect of the invention, flowable, electrically conductive couplers can be disposed at the first connection sites, and a generally non-conductive material can be disposed between the conductive couplers. A gap dimension can be selected based on a target underfill flow rate, and at least a portion of the generally non-conductive material can be removed to form a gap having the selected gap dimension and being positioned between neighboring conductive couplers. The microelectronic substrate and the support member can be connected by attaching the conductive couplers to the second bond sites of the support member, and an underfill material can be flowed into the gap at at least approximately the target underfill material flow rate.

A method in accordance with another aspect of the invention includes providing a first microelectronic substrate having first connection sites carrying first flowable, electrically conductive couplers that define a first plane. A first generally non-conductive material is applied to the first conductive couplers and to the first microelectronic substrate, and at least some of the first generally non-conductive material is removed to recess the first generally non-conductive material from the first plane by a first recess distance. The method can further include providing a second microelectronic substrate having second flowable, electrically conductive couplers defining a second plane spaced apart from the second microelectronic substrate by a second distance different than the first distance. A second generally non-conductive material is applied to the second conductive couplers, and at least some of the second generally non-conductive material is removed from between the second conductive couplers to recess the second generally non-conductive material from the second plane by a second recess distance that is at least approximately the same as the first recess distance.

A method in accordance with still another aspect of the invention includes connecting the microelectronic substrate to the support member by attaching the conductive couplers and disposing at least one generally non-conductive material adjacent to the conductive couplers, with the at least one generally non-conductive material being spaced apart from the support member. In another aspect of the invention, the at least one generally non-conductive material can be a first generally non-conductive material, and the method can further include disposing a second generally non-conductive material adjacent to the support member and the conductive couplers, with the second generally non-conductive material being spaced apart from the first generally non-conductive material.

A method in accordance with yet another aspect of the invention includes providing a first. generally non-conductive material between flowable conductive couplers of a microelectronic substrate, with the first generally non-conductive material being recessed to define a flow channel having an inner region and an outer region disposed outwardly from the inner region. A second generally non-conductive material can be disposed on the support member to form a layer having a first region and a second region disposed outwardly from the first region, with the first region having a greater thickness than the second region. The inner region of the flow channel is then engaged with the first region of the second generally non-conductive material, while the second generally non-conductive material is at least partially flowable, and the microelectronic substrate and the support member are moved toward each other while forcing gas within the flow channel generally outwardly to the outer region of the flow channel.

BRIEF DESCRIPTION OF THE DRAWINGS

FIG. 6 is a partially schematic, exploded cross-sectional side view of two packages having gaps formed in accordance with another embodiment of the invention.

FIGS. 7A–7B illustrate a process for reducing and/or eliminating gaps in a device package having a no-flow underfill material.

DETAILED DESCRIPTION

The present disclosure describes microelectronic substrate packages and methods for forming such packages. The term "microelectronic substrate" is used throughout to include substrates upon which and/or in which microelectronic circuits or components, data storage elements or layers, and/or vias or conductive lines are or can be fabricated. Many specific details of certain embodiments of the invention are set forth in the following description and in FIGS. 2–7B to provide a thorough understanding of these embodiments. One skilled in the art, however, will understand that the present invention may have additional embodiments, and that the invention may be practiced without several of the details described below.

Figure 2:
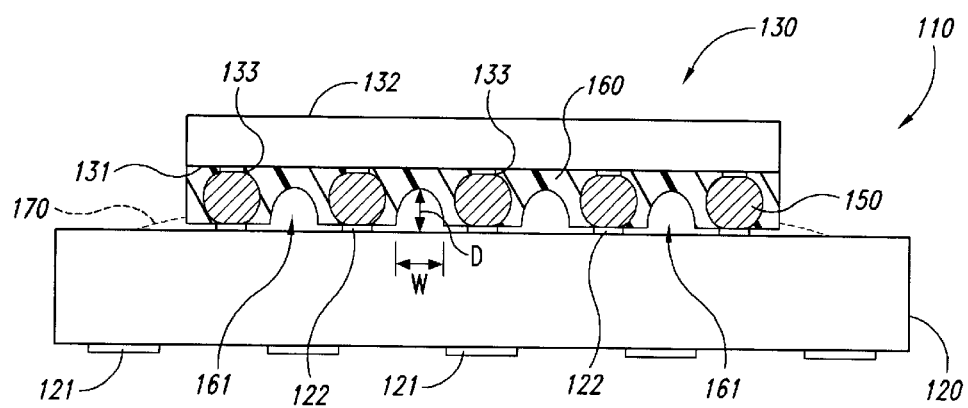
FIG. 2 is a partially schematic, cross-sectional side view of a microelectronic package having fluid flow channels in accordance with an embodiment of the invention.

FIG. 2 is a partially schematic illustration of a package 110 having fluid flow channels 161 in accordance with an embodiment of the invention. In one aspect of this embodiment, the package 110 can include a microelectronic substrate 130 carried by a support member 120. The microelectronic substrate 130 can include a first surface 131, a second surface 132 facing opposite from the first surface 131, and internal components (not visible in FIG. 2), such as memory circuits and/or linking circuitry, positioned between the first surface 131 and the second surface 132. A plurality of first connection sites 133 (such as bond pads) can be coupled to the internal components and can be positioned proximate to the first surface 131;

The support member 120 can include second connection sites 122 (such as bond pads) coupled to the first connection sites 133 with flowable, electrically conductive couplers 150. In one embodiment, the conductive couplers 150 can include solder balls (formed from solder particles disposed in a flux medium) or other conductive materials that can be reflowed after being applied to the microelectronic substrate 130 to form an electrical connection between the microelectronic substrate 130 and the support member 120. In other embodiments, the conductive couplers 150 can include other features and/or compositions. In any of these embodiments, the support member 120 can include third connection sites 121 (such as bond pads) configured to be electrically coupled to other devices and/or circuits external to the package 110.

In a further aspect of an embodiment shown in FIG. 2, the microelectronic substrate 130 can include a generally non-conductive material 160 disposed in the interstices between neighboring conductive couplers 150. Portions of the non-conductive material 160 can be recessed away from the support member 120 to define at least a portion of the fluid flow channels 161. Accordingly, air and/or other fluids can move through the fluid flow channels 161. In yet a further aspect of this embodiment, the fluid flow channels 161 can be in fluid communication with the environment external to the package 110 so that the fluid within the fluid flow channels 161 is free to move into and/or out of the fluid flow channels 161.

In one embodiment, the dimensions of the fluid flow channel 161 can be selected according to design criteria that account for fluid flow rate, package geometry and/or support for the conductive couplers 150. For example, the fluid flow channel 161 can have a transverse or widthwise dimension W that is determined by the spacing between neighboring conductive couplers 150 and/or by the amount of non-conductive material 160 selected to strengthen the connection between the conductive couplers 150 and the first connection sites 133. The depthwise dimension D of the flow channel 161 can be determined based on the height of the conductive couplers 150 and/or by the amount of non-conductive material 160 selected to strengthen the connection between the conductive couplers 150 and the first connection sites 133. Based on these criteria, the fluid flow channel 161 can have a variety of dimensions, and can range from a relatively small channel (e.g., offset from the sides of neighboring conductive couplers 150 and offset the first surface 131 of the microelectronic substrate 120), to a relatively large channel (extending transversely to expose the sides of neighboring conductive couplers 150, and extending depthwise to expose the first surface 131). When the package 110 includes larger fluid flow channels 161, the non-conductive material 160 can be reduced in size to a small ring around each first connection site 133.

The package 110 can further include an optional adhesive layer 170 disposed around a periphery of the non-conductive material 160. The adhesive layer 170 can provide for an additional connection between the microelectronic substrate 130 and the support member 120 and can constrain the relative thermal expansion of these components as the temperature of the package 110 changes. In one embodiment, the adhesive material 170 can be disposed adjacent to two sides of the microelectronic substrate 130, leaving the regions adjacent to the remaining two sides of the microelectronic substrate 130 open to allow fluid to move into and/or out of the fluid flow channels 161.

One feature of an embodiment of the package 110 described above with reference to FIG. 2 is that the fluid flow channels 161 can be in fluid communication with the environment external to the package 110. An advantage of this feature is that any fluid (such as air or another gas) present in the fluid flow channels 161 as the package 110 is fabricated can freely exit the fluid flow channels 161 as the temperature of the package 110 increases. As a result, the package 110 will be less likely to fail due to the pressure exerted by the expanding fluid within the fluid flow channels 161. As the package 110 cools, fluid can re-enter the fluid flow channels 161 so that the package 110 is not subjected to inwardly directed pressure exerted by the environment around the package 110.

Another advantage of the fluid flow channels 161 is that they can provide an avenue for cooling flow to cool the components of the package 110. Accordingly, the cooling flow can be in more intimate contact with the interior portions of the package 110 than existing cooling flows that contact only the external surfaces of the microelectronic substrate 130 and/or the support member 120. As a result, the components in the package 110 may be less likely to overheat and fail at normal operating temperatures, and may be more likely to survive extreme operating temperatures.

Figure 3A:
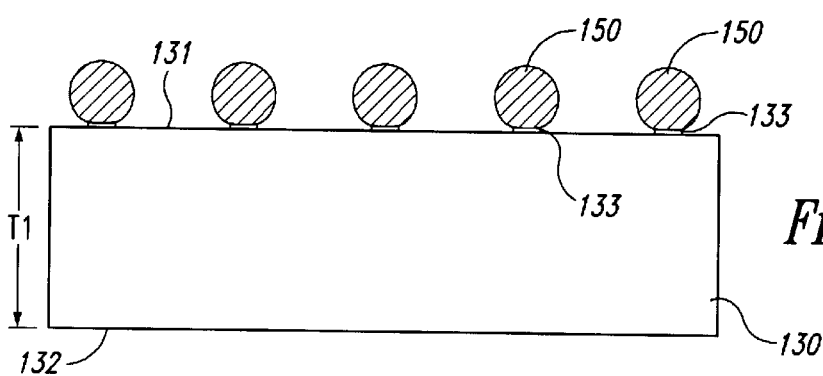
FIGS. 3A–3E illustrate a process for forming fluid flow channels in a microelectronic package in accordance with an embodiment of the invention.
Figure 3B:
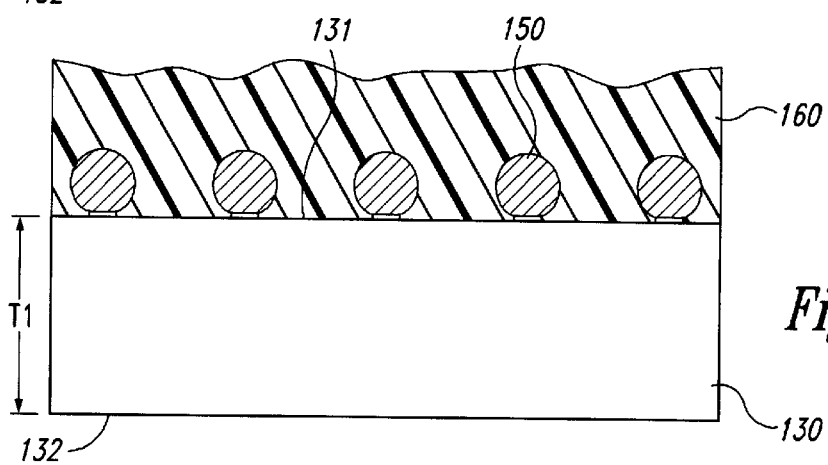

FIGS. 3A–3E schematically illustrate a process for forming a microelectronic package generally similar to that described above with reference to FIG. 2. Beginning with FIG. 3A, the process can include providing a microelectronic substrate 130 having a thickness Ti. The microelectronic substrate 130 can include first connection sites 133 carrying conductive couplers 150, such as solder balls. As shown in FIG. 3B, the non-conductive material 160 can be disposed over the first surface 131 of the microelectronic substrate 130 to cover the conductive couplers 150. In one embodiment, the non-conductive material 160 can include one or more strengthening materials, such as FP 4450, available from Dexter Hysol of Seabrook, N.H. In other embodiments, the non-conductive material 160 can include thermoset epoxy polymers, such as those disclosed in U.S. Pat. No. 6,180,527, incorporated herein in its entirety by reference. In still further embodiments, the non-conductive material 160 can include other generally electrically non-conductive materials.

Figure 3C:
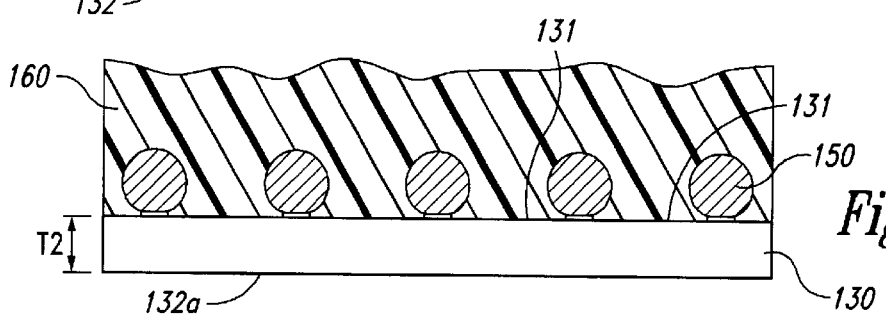

In a further aspect of this embodiment, the non-conductive material 160 can strengthen the microelectronic substrate 130 and can accordingly allow operations on the microelectronic substrate 130 that would not be practical without the non-conductive material 160. For example, material can be removed from the second surface 132 of the microelectronic substrate 130 to thin the microelectronic substrate 130 and form a new second surface 132a, as shown in FIG. 3C. The microelectronic substrate 130 can accordingly have a thickness T2 that is less than the initial thickness Ti shown in FIG. 3B. The thinner microelectronic substrate 130 can be easier to cool and can occupy less volume in the devices in which it is installed. In alternate embodiments that do not materially benefit from this feature, the thinning process described above with reference to FIG. 3C can be eliminated.

Figure 3D:
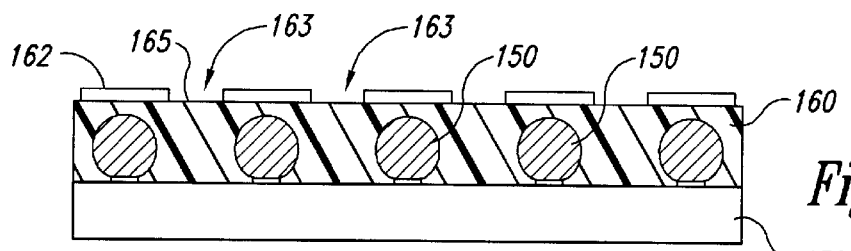
Figure 3E:
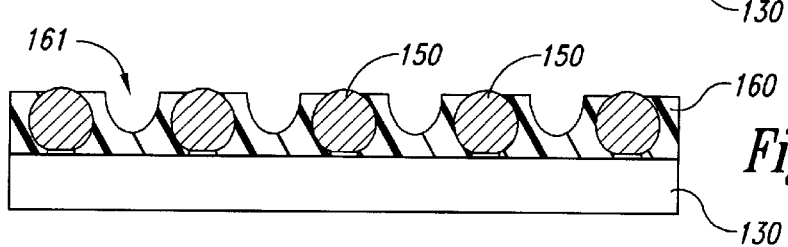

In either of the embodiments described above, at least a portion of the non-conductive material 160 can be removed to form the fluid flow channels 161 shown in FIG. 2. For example, as shown in FIG. 3D, the non-conductive material 160 can first be smoothed and reduced in thickness, for example, by chemical action, mechanical action or chemical mechanical planarization (CMP). A mask 162 can be positioned over the resulting external surface 165 of the non-conductive material 160. The mask 162 can include apertures 163 aligned with the interstices between neighboring conductive couplers 150. The non-conductive material 160 can be exposed to an etchant or other removing agent to form the fluid flow channels 161. The mask 162 can then be removed and any material positioned over the conductive couplers 150 can be excised, as shown in FIG. 3E to expose the tips of the conductive couplers 150. Accordingly, the conductive couplers 150 can bond to a support member 120 (FIG. 2) to form a microelectronic package. Further details of processes for removing portions of the non-conductive material 160 positioned between the conductive couplers 150 are disclosed in U.S. Pat. No. 6,118,179, incorporated herein in its entirety by reference.

In one aspect of an embodiment described above with reference to FIGS. 3A–3E, an anisotropic etchant can be used to form the flow channels 161, and an isotropic etchant can be used to remove the material positioned directly above the conductive couplers 150. In other embodiments, other combinations of etchants and/or process techniques can be used to remove at least a portion of the non-conductive material 160. In still further embodiments (for example, when the inherent structure of the microelectronic substrate 130 is sufficiently strong), the entirety of the non-conductive material 160 can be removed prior to attaching the microelectronic substrate 130 to the support member 120.

Figure 4A:
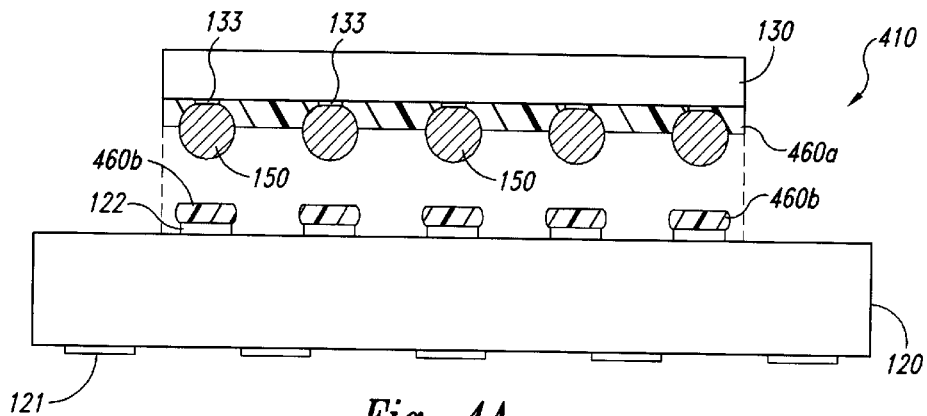
FIGS. 4A–4B illustrate a microelectronic package having portions of non-conductive material separated from each other in accordance with another embodiment of the invention.
Figure 4B:
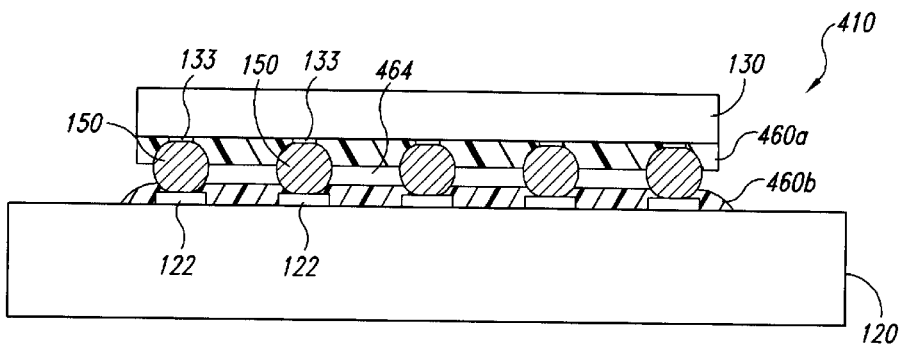

FIGS. 4A–4B illustrate a device package 410 configured in accordance with another embodiment of the invention. Referring first to FIG. 4A, the package 410 can include a support member 120 that carries a microelectronic substrate 130. The microelectronic substrate 130 can include first bond sites 133 and conductive couplers 150 arranged generally as described above with reference to FIGS. 2–3E. A first generally non-conductive material 460a is positioned in the interstitial regions between neighboring conductive couplers 150. The support member 120 can include second bond sites 122, each of which can optionally carry a quantity of a second generally non-conductive material 460b, such as WS609 flux, available from Alpha Metals of Jersey City, N.J., and typically referred to in the industry as a "brick." In one aspect of this embodiment, the second generally non-conductive material 460b can include a "no-clean" fluxing agent and an epoxy. In other embodiments, the second generally non-conductive material 460b can include other constituents, such as a water clean flux. In any of these embodiments, an additional quantity of conductive material (such as solder) can be mixed in with the second generally non-conductive material 460b.

Referring now to FIG. 4B, the microelectronic substrate 130 and the support member 120 can be moved toward each other and heated to reflow the conductive couplers 150 and couple the first connection sites 133 of the microelectronic substrate 130 to the second connection sites 122 of the support member 120. The elevated temperature can also cause the second non-conductive material 460b to flow outwardly from the second connection sites 122. In one embodiment, the second non-conductive material 460b can form a continuous layer in the interstices between the conductive couplers 150, adjacent to the support member 120. In another embodiment, the second non-conductive material 460b can form an isolated meniscus around each conductive coupler 150. In either embodiment, when the second non-conductive material 460b includes an epoxy or other thermoset material, this material is then cured to a hardened, solid state.

In one aspect of an embodiment of the package 410 described above with reference to FIGS. 4A and 4B, the second non-conductive material 460b can extend from the support member 120, part-way along the sides of the conductive couplers 150, and the first non-conductive material 460a can extend from the microelectronic substrate 130, part-way along the sides of the conductive couplers 150 without contacting the first non-conductive material 460a. Accordingly, the package 410 can include gaps 464 between the first non-conductive material 460a and the second non-conductive material 460b. An advantage of this feature is that the gaps 464 can act as cooling flow channels, in a manner generally similar to that described above with reference to FIG. 2. Accordingly, the package 410 can operate more efficiently and/or be less likely to fail when exposed to high temperatures.

Another advantage of the gaps 464 is that they limit the structural connection between the microelectronic substrate 130 and the support member 120 to the link provided by the conductive couplers 150. Accordingly, the microelectronic substrate 130 can be removed from the support member 120, for example, by elevating the temperature of the conductive couplers 150, causing the conductive couplers 150 to reflow. If either the microelectronic substrate 130 or the support member 120 is defective, the defective component can be separated from the package 410 (without damaging the non-defective component) and replaced with another, comparable component.

Figure 5:
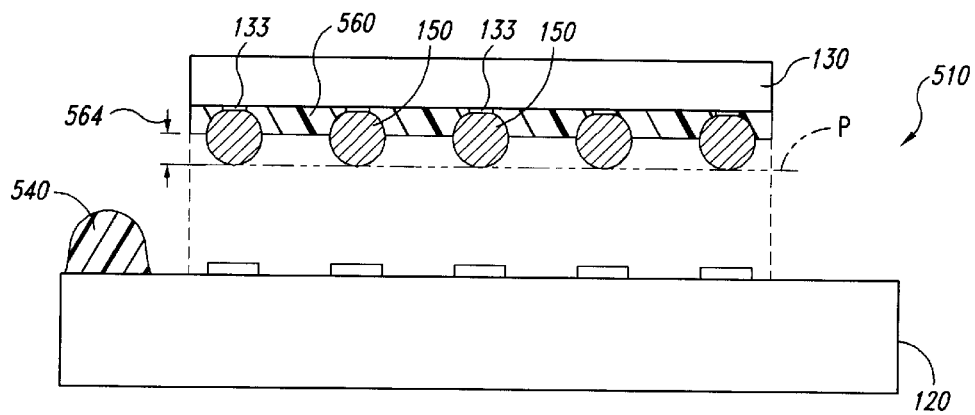
FIG. 5 is a partially schematic, exploded cross-sectional side view of a microelectronic package having a gap positioned to control the flow of underfill material adjacent to a microelectronic substrate.

FIG. 5 is a partially exploded, cross-sectional side view of a package 510 configured in accordance with another embodiment of the invention. In one aspect of this embodiment, the package 510 can include a support member 120 that carries a microelectronic substrate 130. The microelectronic substrate 130 can include conductive couplers 150 positioned on the first connection sites 133 in a manner generally similar to that described above with reference to FIG. 2. The microelectronic substrate 130 can further include a generally non-conductive material 560 positioned in the interstices between the conductive couplers 150.

In a further aspect of this embodiment, the outer surfaces of the conductive couplers 150 can define a plane P and the outer surface of the non-conductive material 560 can be recessed from the plane P to provide a gap 564. The gap 564 can be selectively sized such that when the microelectronic substrate 130 is connected to the support member 120 and an underflow material 540 flows into the gap 564 from a position adjacent to the microelectronic substrate 130, the underflow material 540 will tend to wick more quickly into the gap 564 than around the periphery of the microelectronic substrate 130. For example, the gap 564 can have a depth of about 25 microns in one embodiment. In other embodiments, the gap 564 can have other depths greater than or less than 25 microns. In still further embodiments, the gap 564 can have a size based on the mean diameter of particulates in the underflow material 540. For example, the gap 564 can have a depth that is about three times the mean diameter of such particulates. Suitable underflow materials 540 are available from Locktite Corp. of Rocky Hills, Conn., Nagase America Corp. of New York, N.Y., and Dexter Hysol of Seabrook, N.H.

Figure 1:
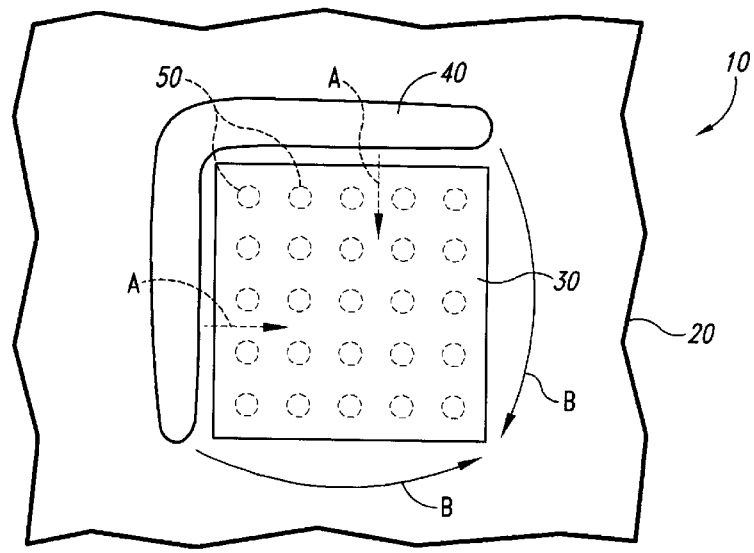
FIG. 1 is a partially schematic, plan view of a microelectronic package formed by a method in accordance with the prior art.

In any of the foregoing embodiments described above with reference to FIG. 5, (and in contrast to the process described above with reference to FIG. 1), the underflow material 540 flowing through the gap 564 will tend to push out any gas in the gap 564 before wicking around the periphery of the microelectronic substrate 130 and sealing off the gap 564. An advantage of this arrangement is that by reducing and/or eliminating trapped gas between the microelectronic substrate 130 and support member 120, the package 510 will be less likely to fail as it undergoes temperature excursions.

FIG. 6 is a partially exploded, cross-sectional side view of two device packages 610 (shown as a first package 610a and a second package 610b) configured in accordance with still another embodiment of the invention. In one aspect of this embodiment, the first package 610a can include a first support member 620a that carries a first microelectronic substrate 630a. The first microelectronic substrate 630a can include a plurality of first conductive couplers 650a and a first generally non-conductive material 660a disposed in the interstices between the first conductive couplers 650a. The first conductive couplers 650a can define a plane P1, and the first non-conductive material 660a can be recessed from the plane P1 to define a gap 664a. When the first microelectronic substrate 630a is positioned adjacent to the support member 620a, an underfill material 640a can flow through the gap 664a at a pre-selected rate, in a manner generally similar to that described above with reference to FIG. 5.

The second package 610b can include a second support member 620b and a second microelectronic substrate 630b. The second microelectronic substrate 630b can include second conductive couplers 650b that are larger than the first conductive couplers 650a and that define a plane P2. A second non-conductive material 660b can be disposed in the interstices between neighboring second conductive couplers 650b and can be recessed from the plane P2 to define a second gap 664b.

In one aspect of an embodiment shown in FIG. 6, the second gap 664b can have approximately the same depth as the first gap 664a, even though the second conductive couplers 650b are substantially larger than the first conductive couplers 650a. Accordingly, the second package 610b can include a volume of second underflow material 640b that has approximately the same size as the first underflow material volume 640a. An advantage of this arrangement is that packages having larger conductive couplers 650b need not necessarily require larger volumes of underflow material. Accordingly, the cost of packages having larger conductive couplers can be reduced when compared to existing devices.

FIGS. 7A–7B illustrate a process for forming a device package 710 in accordance with still another embodiment of the invention. In one aspect of this embodiment, the package 710 can include a support member 720 and a microelectronic substrate 730. The microelectronic substrate 730 can include conductive couplers 750 and a generally non-conductive material 760 disposed in the interstices between neighboring conductive couplers 750. The generally non-conductive material 760 can be recessed from the outer surfaces of the conductive couplers 750 to form a gap 764.

In a further aspect of this embodiment, the support member 720 can include an upper surface 723, connection sites 722 at least proximate to the upper surface 723, and a generally non-conductive, no-flow underfill material 740 disposed on the upper surface 723 and the second connection sites 722. Suitable no-flow underfill materials are available from Locktite Corp., Nagase America Corp., and Dexter Hysol Corp. The underfill material 740 can have a generally domed shape before the microelectronic substrate 730 is connected to the support member 720. Accordingly, when the microelectronic substrate 730 is brought into contact with the underfill material 740, the underfill material 740 will tend to fill the central portion of the gap 764 before filling the outer portion of the gap 764. As the microelectronic substrate 730 and the support member 720 move closer together, the underfill material 740 forces the gas in the gap 764. generally outwardly. Accordingly, as shown in FIG. 7B, the completed package 710 can have the underfill material 740 completely filling the gap 764. An advantage of this arrangement is that, by reducing and/or eliminating trapped gas between the support member 720 and the microelectronic substrate 730, the package 710 will be less likely to fail during temperature excursions.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

What is claimed is:

1. A method for packaging a microelectronic substrate, comprising:

positioning a microelectronic substrate proximate to a support member, the microelectronic substrate having a first surface, a second surface facing opposite from the first surface, and a plurality of first connection sites at least proximate to the first surface, the support member having a plurality of second and third connection sites;

connecting the microelectronic substrate to the support member by attaching a plurality of electrically conductive couplers between the plurality of first connection sites of the microelectronic substrate and the plurality of second connection sites of the support member, with neighboring conductive couplers being spaced apart to define at least one fluid flow channel, and with the support member and the microelectronic substrate forming a package;

applying an adhesive material at an interface between the microelectronic substrate and the support member, with the adhesive material having at least one opening positioned to allow fluid communication between the at least one fluid flow channel and a region external to the package; and providing the package for electrical coupling to other electrical structures, with the third connection sites accessible for electrical coupling to the other electrical structures, and with the at least one fluid flow channel accessible to the region external to the package.

2. The method of claim 1, further comprising removing material from the second surface of the microelectronic substrate to thin the microelectronic substrate.

3. The method of claim 1, further comprising cooling the microelectronic substrate by passing a flow of gaseous fluid through the at least one fluid flow channel while the package is electrically coupled to the other electrical structures.

4. The method of claim 1, wherein the microelectronic device has a first side between the first and second surfaces and a second side opposite the first side, wherein the at least one flow channel includes an entrance at least proximate to the first side and an exit at least proximate to the second side, and wherein the method further comprises passing a flow of gaseous fluid from the entrance to the exit of the at least one fluid flow channel while the package is electrically coupled to the other electrical structures.

5. The method of claim 1, further comprising passively cooling the microelectronic substrate by flowing a gaseous fluid through the at least one fluid flow channel.

6. A method for packaging a microelectronic substrate, comprising:

positioning a microelectronic substrate proximate to a support member, the microelectronic substrate having a first surface, a second surface facing opposite from the first surface, and a plurality of first connection sites at least proximate to the first surface, the support member having a plurality of second and third connection sites;

connecting the microelectronic substrate to the support member by attaching a plurality of electrically conductive couplers between the plurality of first connection sites of the microelectronic substrate and the plurality of second connection sites of the support member, with neighboring conductive couplers being spaced apart to define at least one fluid flow channel, and with the support member and the microelectronic substrate forming a package;

applying a generally non-conductive material to the first surface of the microelectronic substrate adjacent to the conductive couplers;

forming at least a portion of the at least one fluid flow channel by removing at least some of the generally non-conductive material from between at least some of the conductive couplers; and providing the package for electrical coupling to other electrical structures, with the third connection sites accessible for electrical coupling to the other electrical structures, and with the at least one fluid flow channel accessible to a region external to the package.

7. The method of claim 6, further comprising cooling the microelectronic substrate by passing a flow of gaseous fluid through the at least one fluid flow channel while the package is electrically coupled to the other electrical structures.

8. The method of claim 6, further comprising selecting the conductive couplers to include solder balls.

9. The method of claim 6, further comprising removing material from the second surface of the microelectronic substrate to thin the microelectronic substrate.

10. The method of claim 6 wherein the microelectronic device has a first side between the first and second surfaces and a second side opposite the first side, wherein the at least one flow channel includes an entrance at least proximate to the first side and an exit at least proximate to the second side, and wherein the method further comprises passing a flow of gaseous fluid from the entrance to the exit of the at least one fluid flow channel while the package is electrically coupled to the other electrical structures.

11. The method of claim 6, further comprising passively cooling the microelectronic substrate by flowing a gaseous fluid through the at least one fluid flow channel.

12. A method for packaging a microelectronic substrate, comprising:

positioning a microelectronic substrate proximate to a support member, the microelectronic substrate having a first surface, a second surface facing opposite from the first surface, and a plurality of first connection sites at least proximate to the first surface, the support member having a plurality of second and third connection sites;

connecting the microelectronic substrate to the support member by attaching a plurality of electrically conductive couplers between the plurality of first connection sites of the microelectronic substrate and the plurality of second connection sites of the support member, with neighboring conductive couplers being spaced apart to define at least one fluid flow channel, and with the support member and the microelectronic substrate forming a package;

applying a generally non-conductive material to the first surface of the microelectronic substrate and adjacent to the conductive couplers;

forming at least a portion of the at least one fluid flow channel by removing at least some of the material from between at least some of the conductive couplers to expose at least a portion of the conductive couplers; and providing the package for electrical coupling to other electrical structures, with the third connection sites accessible for electrical coupling to the other electrical structures, and with the at least one fluid flow channel accessible to a region external to the package.

13. The method of claim 12, further comprising removing material from the second surface of the microelectronic substrate to thin the microelectronic substrate.

14. The method of claim 12, further comprising cooling the microelectronic substrate by passing a flow of gaseous fluid through the at least one fluid flow channel while the package is electrically coupled to the other electrical structures.

15. The method of claim 12, wherein the microelectronic device has a first side between the first and second surfaces and a second side opposite the first side, wherein the at least one flow channel includes an entrance at least proximate to the first side and an exit at least proximate to the second side, and wherein the method further comprises passing a flow of gaseous fluid from the entrance to the exit of the at least one fluid flow channel while the package is electrically coupled to the other electrical structures.

16. The method of claim 12, further comprising passively cooling the microelectronic substrate by flowing a gaseous fluid through the at least one fluid flow channel.

17. A method for packaging a microelectronic substrate, comprising:

positioning a microelectronic substrate proximate to a support member, the microelectronic substrate having a first surface, a second surface facing opposite from the first surface, and a plurality of first connection sites at least proximate to the first surface, the support member having a plurality of second and third connection sites;

connecting the microelectronic substrate to the support member by attaching a plurality of electrically conductive couplers between the plurality of first connection sites of the microelectronic substrate and the plurality of second connection sites of the support member, with neighboring conductive couplers being spaced apart to define at least one fluid flow channel, and with the support member and the microelectronic substrate forming a package;

applying a generally non-conductive first material to the first surface of the microelectronic substrate adjacent to the conductive couplers;

applying a generally non-conductive second material to the support member, with the first and second generally non-conductive materials being separated by a gap, and with the gap defining at least part of the at least one fluid flow channel; and providing the package for electrical coupling to other electrical structures, with the third connection sites accessible for electrical coupling to the other electrical structures, and with the at least one fluid flow channel accessible to a region external to the package.

18. The method of claim 6, further comprising selecting the microelectronic substrate to include at least one memory device.

19. The method of claim 17, further comprising removing material from the second surface of the microelectronic substrate to thin the microelectronic substrate.

20. The method of claim 17, further comprising cooling the microelectronic substrate by passing a flow of gaseous fluid through the at least one fluid flow channel while the package is electrically coupled to the other electrical structures.

21. The method of claim 17, wherein the microelectronic device has a first side between the first and second surfaces and a second side opposite the first side, wherein the at least one flow channel includes an entrance at least proximate to the first side and an exit at least proximate to the second side, and wherein the method further comprises passing a flow of gaseous fluid from the entrance to the exit of the at least one fluid flow channel while the package is electrically coupled to the other electrical structures.

22. The method of claim 17, further comprising passively cooling the microelectronic substrate by flowing a gaseous fluid through the at least one fluid flow channel.

* * * * *

UNITED STATES PATENT AND TRADEMARK OFFICE
CERTIFICATE OF CORRECTION

PATENT NO. : 6,673,649 B1　　　　　　　　　　　　　　　　　　　　　　　Page 1 of 1
DATED : January 6, 2004
INVENTOR(S) : William Mark Hiatt et al.

It is certified that error appears in the above-identified patent and that said Letters Patent is hereby corrected as shown below:

Column 4,
Line 9, semicolon should be a period;

Signed and Sealed this

Fifteenth Day of June, 2004

JON W. DUDAS
*Acting Director of the United States Patent and Trademark Office*